United States Patent

Badgley et al.

Patent Number: 6,019,272
Date of Patent: Feb. 1, 2000

[54] METHOD FOR ATTACHING A TERMINAL CONNECTOR TO A METALLIC SURFACE

[75] Inventors: John Scott Badgley, Garden City; Dawn Roberta White, Ann Arbor; Richard Lawrence Allor, Livonia; Samir Samir, Inkster, all of Mich.

[73] Assignee: Ford Global Technologies, Inc., Dearborn, Mich.

[21] Appl. No.: 08/967,537

[22] Filed: Nov. 12, 1997

[51] Int. Cl.[7] .......................... H01L 21/60; B23K 20/12
[52] U.S. Cl. ........................ 228/114.5; 228/179.1; 228/254
[58] Field of Search ................... 228/114, 114.5, 228/110.1, 111.5, 179.1, 254; 29/876–879

[56] References Cited

U.S. PATENT DOCUMENTS

| | | |
|---|---|---|
| 2,779,998 | 2/1957 | Bailey . |
| 3,121,948 | 2/1964 | Hollander et al. . |
| 3,269,002 | 8/1966 | Hollander et al. . |
| 3,296,692 | 1/1967 | Griffin ................................. 228/122.1 |
| 3,973,715 | 8/1976 | Rust . |
| 4,388,522 | 6/1983 | Boaz . |
| 4,450,346 | 5/1984 | Boaz . |
| 4,542,843 | 9/1985 | Middleton . |
| 4,566,924 | 1/1986 | Hara et al. . |
| 4,628,150 | 12/1986 | Luc ....................................... 174/88 C |
| 4,890,782 | 1/1990 | Nakai et al. . |
| 4,948,029 | 8/1990 | Haisma et al. . |
| 5,073,461 | 12/1991 | DeKoven et al. . |
| 5,277,356 | 1/1994 | Kawauchi .............................. 228/111 |
| 5,288,006 | 2/1994 | Otsuka et al. . |
| 5,715,989 | 2/1998 | Kee ....................................... 228/114.5 |

FOREIGN PATENT DOCUMENTS

| | | |
|---|---|---|
| 476840 | 5/1929 | Germany . |
| 2 219 290 | 1/1974 | Germany . |
| 1 204 344 | 1/1986 | U.S.S.R. . |
| 995678 | 6/1965 | United Kingdom . |
| 1 481 215 | 7/1977 | United Kingdom . |

*Primary Examiner*—Samuel M. Heinrich
*Attorney, Agent, or Firm*—Leslie C. Hodges

[57] ABSTRACT

There is disclosed herein a method for attaching a terminal to a metallic mating surface on a workpiece by friction joining, comprising the steps of: (1) providing the terminal and the workpiece, wherein the terminal comprises an electrically conductive body having a top end to which an electrical connector may be attached, a bottom end having a bottom surface generally conforming to the mating surface of the workpiece, a rotational axis substantially orthogonal to the bottom surface about which the terminal may be rotated, and a layer of solder attached to the bottom surface wherein the layer has an outer perimeter and defines a central solder-free region about the axis; (2) rotating the terminal about its rotational axis at a predetermined rotational speed while holding the workpiece stationary; (3) pressing together the rotating terminal and the stationary workpiece using a predetermined forging force for a predetermined length of time, so as to promote a galling bond between the mating surfaces; and (4) abruptly stopping the rotation of the terminal. During the pressing together step, the solder is generally maintained at an average temperature below its melting temperature.

12 Claims, 3 Drawing Sheets

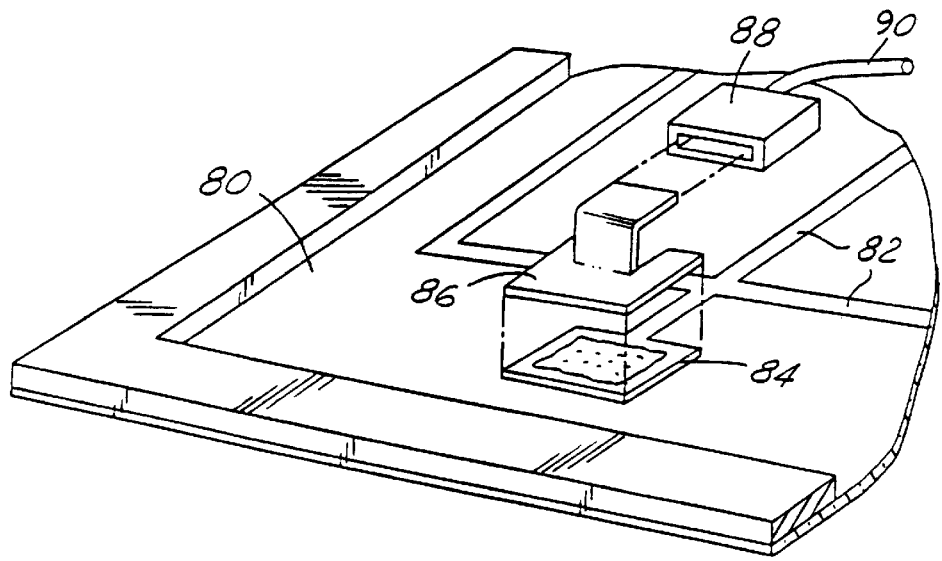
FIG. 1
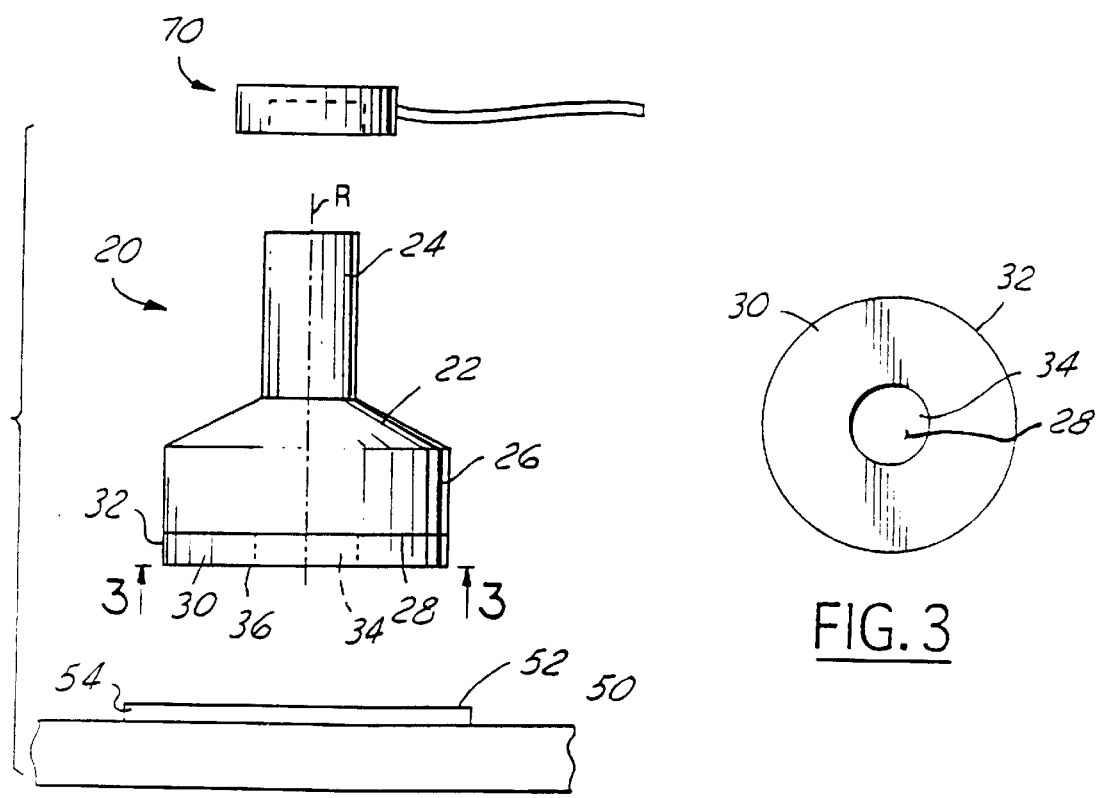
FIG. 2
FIG. 3

METHOD FOR ATTACHING A TERMINAL CONNECTOR TO A METALLIC SURFACE

BACKGROUND OF THE INVENTION

1. Field of the Invention

The present invention relates generally to terminal connectors. More particularly, the present invention relates to a method for attaching a terminal connector to a metallic surface by friction joining.

2. Disclosure Information

Practically all automotive vehicles produced today have front and rear glass windshields. It is common practice to provide one or both of such windshields with a wire circuit either attached to or embedded within the windshield. These wire circuits may be used for a variety of purposes, such as an antennae for sending/receiving radio frequency signals, a high resistance windshield defroster circuit, and so forth, as illustrated in FIG. 1. Here, the windshield 80 has a wire circuit 82 attached thereto, with each end of the circuit having a termination 84. Typically, each termination 84 has a metal clip-like connector 86 attached thereto, with a mating external circuit connector 88 being attached to the clip connector 86. The external circuit 90 in turn may be connected to a radio, a theft prevention/detection system, a keyless entry system, a cellular phone, a power circuit for defrosting the windshield, etc.

The typical method used to attach the metal connector 86 to the glass windshield 80 involves the following steps. First, a glass particle/silver particle paste or "frit" is deposited onto the windshield adjacent to and in contact with the circuit termination 84. Second, the fritted windshield is fired in an oven such that the glass of the windshield and the glass particles in the frit soften so as to bond to each other. This causes the fired frit deposit—at this point referred to as a "pad"—to bond to the glass, while the silver particles distributed throughout the pad create an electrically conductive path from the termination 84 to the top surface of the pad. Third, a predetermined amount of solder is deposited atop the pad. And fourth, the metal clip connector 86 is placed on the solder and the solder is heated to a temperature well above its melting point and then allowed to cool, so that the clip is soldered to the pad.

However, this approach presents a problem in that the heat used to melt the solder also increases the risk of cracking the adjacent windshield glass. Furthermore, upon cooling from these elevated temperatures, there is a tendency for one or more of the connector, solder, pad, and glass to delaminate and/or debond from each other due to the large differences among their respective coefficients of thermal expansion.

It would be desirable, therefore, to provide a terminal connector and a method for attaching the same to a windshield or other fragile workpiece without subjecting the workpiece to the elevated temperatures presented by previously known processes.

SUMMARY OF THE INVENTION

The present invention overcomes the disadvantages of the prior art by providing a terminal and a method for attaching the same to a metallic surface on a workpiece using friction joining. One method for attaching a terminal to a metallic mating surface on a workpiece by friction joining comprises the steps of: (1) providing the terminal and the workpiece, wherein the terminal comprises an electrically conductive body having a top end to which an electrical connector may be attached, a bottom end having a bottom surface generally conforming to the mating surface of the workpiece, a rotational axis substantially orthogonal to the bottom surface about which the terminal may be rotated, and a layer of solder attached to the bottom surface wherein the layer has an outer perimeter and defines a central solder-free region about the axis; (2) rotating the terminal about its rotational axis at a predetermined rotational speed while holding the workpiece stationary; (3) pressing together the rotating terminal and the stationary workpiece using a predetermined forging force for a predetermined length of time, so as to promote a galling bond between the mating surfaces; and (4) abruptly stopping the rotation of the terminal. During the pressing together step, the solder is generally maintained at an average temperature below its melting temperature.

It is an object and advantage of the present invention that attachment of the terminal to the workpiece as described herein exposes the workpiece to significantly less heat than is the case with conventional methods, such as soldering. This reduces the risk of damaging the workpiece.

These and other advantages, features and objects of the invention will become apparent from the drawings, detailed description and claims which follow.

BRIEF DESCRIPTION OF THE DRAWINGS

FIG. 1 is a perspective view of a clip terminal attached to glass windshield of an automotive vehicle according to the prior art.

FIG. 2 is an elevation view of a terminal according to a first embodiment of the present invention.

FIG. 3 is an end view of the terminal shown in FIG. 2 as viewed along line 3—3.

DETAILED DESCRIPTION OF THE PREFERRED EMBODIMENTS

Figure 4:
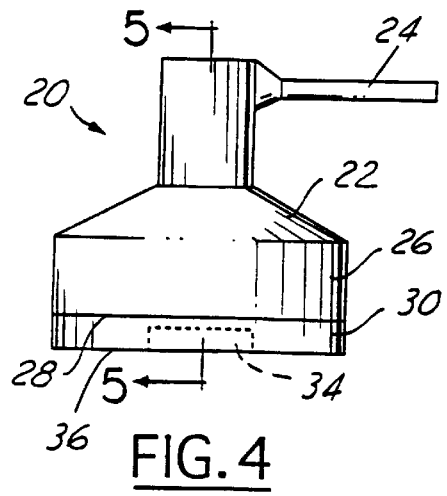
FIG. 4 is an elevation view of a terminal according to an alternative first embodiment of the present invention.

Referring now to the drawings, FIG. 2 shows a terminal connector 20 attachable to a metallic mating surface 52 on a workpiece 50 by friction joining according to a first embodiment of the present invention. The connector 20 comprises an electrically conductive body 22 having a top end 24 to which an electrical connector 70 may be attached, a bottom end 26 having a bottom surface 28 generally conforming to the mating surface 52 of the workpiece 50, and an axis R substantially orthogonal to the bottom surface 28 about which the terminal 20 may be rotated. Attached to the bottom surface 28 is a layer of solder 30 having an outer perimeter 32 and defining a central solder-free region 34 about the axis R.

Figure 5:
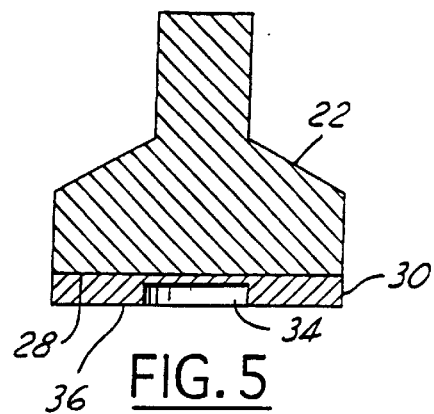
FIG. 5 is a section view of the terminal shown in FIG. 4 as viewed along line 5—5.

In a preferred embodiment, the body 22 is substantially rigid and is constructed of aluminum and/or copper. The bottom surface 28 of the terminal 20 is substantially flat and substantially circular in shape, and the layer of solder 30 is substantially annular in shape with the central solder-free region 34 being substantially circular and generally concentric with the rotational axis R, as shown in FIGS. 2 and 3. The terminal 20 may be symmetric about its rotational axis R (i.e., the terminal shape may be a solid of revolution) as shown in FIG. 2, or it may assume some other shape, such as the configuration illustrated in FIG. 4. The solder-free region 34 may extend from the solder layer mating surface 36 completely down to the bottom surface 28 of the body 22 as shown in FIG. 2, or it may extend down to only a portion of this depth, as illustrated in FIGS. 4 and 5. Of course, other configurations of bottom surface 28, solder layer 30, and central solder-free region 34 are possible which are still within the scope of the present invention.

The terminal 20 may be attached to the workpiece 50 in the following manner. First, the workpiece 50 is held stationary while the terminal 20 is rotated about its rotational axis R. The specific rotational speed used will depend on several factors, such as the surface area of the solder layer 36, the size of the solder-free region 34, the solder composition used, the thermal and mechanical characteristics of the workpiece mating surface 52 to which the solder layer 30 is to be attached, etc. Generally, though, the speed will be in the range of 1000 to 8000 RPM, with 4000 RPM being nominal. Second, the mating solder layer surface 36 of the rotating terminal 20 is brought into contact with the mating surface 52 of the workpiece 50 for a predetermined length of time and using a predetermined amount of "forging" force. The same factors affecting rotational speed will likewise affect the specific length of time and amount of force used. For example, experiments using copper terminals with a 0.357-inch to 0.418-inch diameter bottom surface with a conventional tin/lead solder layer of the same diameter having a 0.125-inch diameter central solder-free region produced satisfactory results using 120 pounds of force (i.e., 220 to 300 p.s.i.) with 1 to 6 seconds of rotational contact. Third, the rotation of the terminal 20 is abruptly stopped, preferably within a single revolution and most preferably within one-tenth of a revolution.

When the rotating terminal and stationary workpiece are forced together for a short time, followed by an abrupt stoppage of the rotation, a bond is formed between the terminal and workpiece. Scanning electron micrograph (SEM) samples show that a galling action occurs between the solder in the solder layer and the metal in the workpiece at the interface between the mating surfaces 36/52, thereby forming the bond. The samples also show that during the rotational contact, some of the solder becomes plastically deformed—but not quite melted—due to the heating and shearing caused by the rotational contact, and is smeared between the mating surfaces. These samples further indicate that a strong bond can be formed (1) without generalized melting of the solder and (2) without the appreciable formation of intermetallic compounds. This is in contrast with conventional soldering, which normally requires both melting of the solder and the formation of intermetallics, of course, increasing the rotational speed, forging force, and/or rotational contact time will in fact cause a more generalized melting of the solder and formation of intermetallics to occur, with a resultant strong bond; however, it is important to note that the additional speed, force, and/or time are not necessary in order to form an acceptably strong bond between the terminal and workpiece according to the present invention.

An important aspect of the present invention is the central solder-free region 34. The importance of this region 34 can perhaps best be illustrated by explaining how its absence would affect the above process. If the solder layer 30 had no central solder-free region—e.g., if it were disk-shaped rather than annular—the tangential component of the rotational speed of the solder located in the center of the layer (i.e., adjacent the axis R) would approach zero. With such little tangential speed, very little friction and heat are developed there, thus preventing the solder in this region from plastically deforming. Although solder proximate the outer perimeter 32 would tend to plastically deform due to the much higher tangential speed there, once the thin layer of plastically deformed solder smears away, the non-plastically-deformed region at the center would prevent further solder near the perimeter from becoming sufficiently plastically deformed. With the central region remaining relatively solid, that plastically deformed portion of the solder near the perimeter would tend to be spun outward beyond the perimeter where it would no longer experience the forging pressure between the mating surfaces; here the spun-out solder would cool and form solder flash.

However, in the present invention there is no solder in the central region, thus alleviating the above problem. Also, the central solder-free region provides a reservoir where plastically deformed solder can be pushed into as the terminal and workpiece are in rotational contact with each other.

Figure 6:
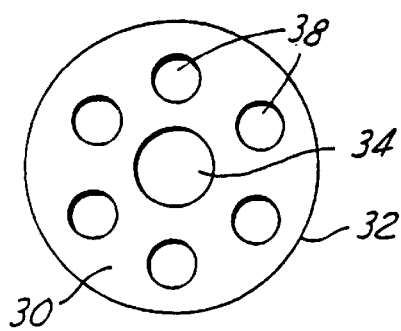
FIGS. 6–8 are bottom views of a terminal according to a first embodiment of the present invention.
Figure 7:
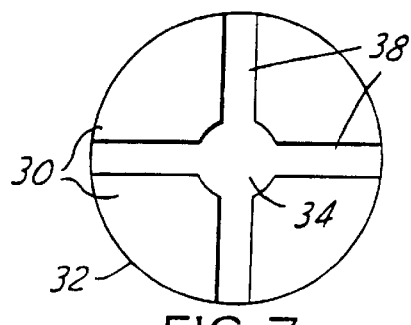

This embodiment can be further improved by providing one or more additional solder-free regions 38 in the solder layer 30 between the central solder-free region 34 and the outer perimeter 32. Each additional region 38 may be contiguous with the central solder-free region 34 and/or with the outer perimeter 32 of the solder layer 30, or may be non-contiguous with both. The shape of each region 38 may be circular, square, ellipsoidal, or any other shape, as illustrated in FIG. 6, with the preferred shape being that of a radial groove contiguous with both the central region 34 and the outer perimeter 32, as illustrated in FIG. 7. When more than one additional region 38 is provided, they should preferably be substantially evenly spaced about the rotational axis R.

Figure 8:
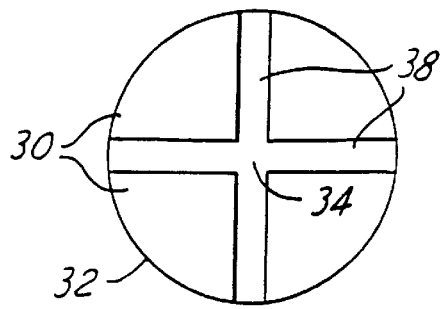

It should be noted that the terminal 20 can also have radial grooves 38 as illustrated in FIG. 8. Here, the radial grooves can be viewed as "diametrical" grooves which "cross" in the center of the solder layer and define a central solder-free region 34 thereat. Thus, it is possible to have one or more radial grooves which inherently define a solder-free central region at the center from which they radiate, without there necessarily being a separately defined central solder-free region.

As the terminal 20 is rotated in contact with the workpiece 50, plastically deformed solder can be smeared away into the additional region(s) 38, thereby exposing more solder underneath the smeared away solder as the terminal 20 continues to rotate. It is preferable that succeeding layers of not-yet-plastically-deformed solder be exposed because solid (i.e., not-yet-plastically-deformed) solder provides much higher friction with the mating workpiece surface 52 than does plastically deformed solder. This higher friction helps heat the mating surfaces 36/52 much quicker so that enough heat is generated to facilitate the galling bond upon stoppage of the rotational motion without transferring as much heat to the workpiece (which may be important if the workpiece is heat-sensitive).

Figure 9:
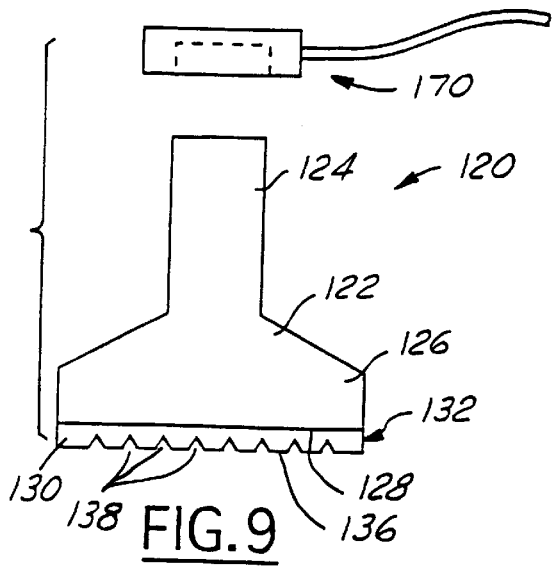
FIG. 9 is an elevation view of a terminal according to a second embodiment of the present invention.
Figure 10:
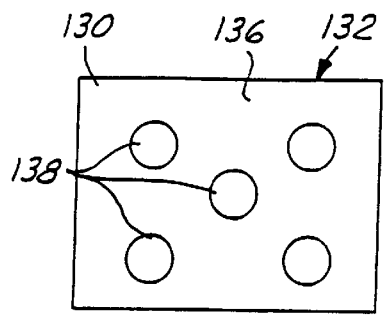
FIGS. 10–11 are bottom views of a terminal according to a second embodiment of the present invention.
Figure 11:
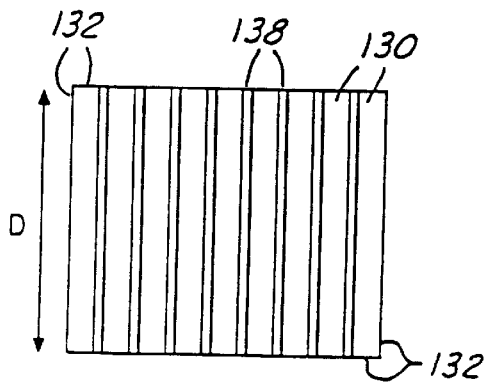

As an alternative to using rotational motion to effect a bond between the terminal and the workpiece, reciprocal motion may be used instead, in conjunction with a second embodiment of the present invention. A "reciprocal" terminal 120 suited for this type of motion, as illustrated in FIG. 9, would differ from the "rotational" terminal 20 of the first embodiment described above in at least two respects. First, there would be no concern whether the reciprocal terminal 120 has a rotational axis R (although it geometrically may have a rotational axis and yet be otherwise adapted for reciprocal motion). And second, there would be no need for a central, solder-free region (although it could have one). Like the rotational terminal 20, a reciprocal terminal 120 would comprise an electrically conductive body 122 having a top end 124 to which an electrical connector 170 may be attached, a bottom end 126 having a substantially flat bottom surface 128, and a layer of solder 130 attached to the bottom surface 128. In the present embodiment 120, the solder layer 130 defines at least one solder-free region 138 therein; each region 138 may be circular (as illustrated in FIG. 10), square, ellipsoidal, diamond-shaped, or any other geometric shape. In a preferred embodiment, the solder layer 130 defines a plurality of substantially straight longitudinal solder-free grooves 138 oriented substantially parallel with a direction D in which the terminal 120 may be reciprocated, as illustrated in FIG. 11. These grooves may extend across the entire solder layer surface 136 and be contiguous with the outer perimeter 132 at either end, as in FIG. 11, or they may be contiguous therewith at only one or neither end.

Figure 12:
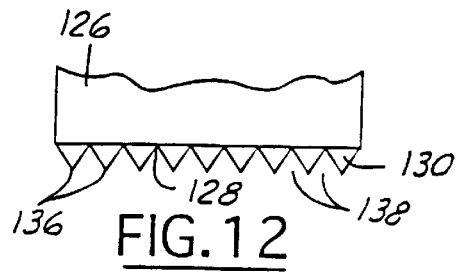
FIGS. 12–13 are section views of a terminal according to a second embodiment of the present invention.
Figure 13:
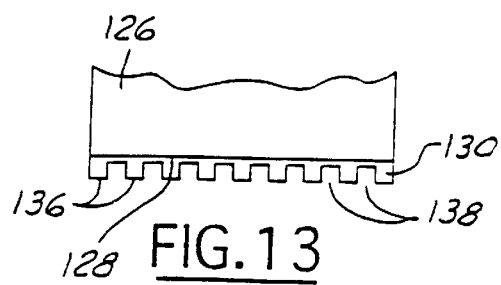

The grooves may assume a profile such as shown in FIGS. 12 and 13, or they may assume other profiles. As with the rotational terminal 20, the depth of the solder-free region(s) 138 may extend from the solder layer mating surface 136 completely down to the bottom surface 128 of the body 122 as shown in FIG. 12, or may extend down to only a portion of this depth, as illustrated in FIG. 13.

The reciprocal terminal 120 may be attached to the workpiece 150 in either of the two following approaches. In the first approach, the terminal 120 and the workpiece 150 are brought into contact with each other such that their respective mating surfaces 136/152 contact one another. Next, either the workpiece or the terminal is held stationary, while the other is reciprocated rapidly back-and-forth across the mating surface interface at a predetermined rate while a predetermined forging force is applied substantially orthogonal to the mating surface interface so as to press the terminal and workpiece together. The reciprocating motion and forging force are maintained for a predetermined length of time, in order to heat the solder and workpiece surfaces 136/152 enough to promote galling of one metal into another without necessarily requiring (but not necessarily precluding) melting of the solder. Then, the reciprocating motion is abruptly stopped, preferably within a single stroke, while the forging force is maintained. This creates a bond between the terminal and workpiece mating surfaces 136/152, similar to that created in the first embodiment above. The forging force may then be relieved and the bonded terminal/workpiece combination used in any subsequent process, such as in the attachment of an electrical connector 170 to the top end 124 of the terminal 120.

Alternatively, a second approach to bonding together the terminal and workpiece involves switching a couple of steps from the first approach. Namely, either the workpiece or terminal is held stationary and the other is reciprocated rapidly back-and-forth at a predetermined rate, and then the workpiece and terminal are brought together such that their respective mating surfaces 136/152 are in contact with each other, whereupon a predetermined forging force is applied substantially orthogonal to the mating surface interface so as to press the terminal and workpiece together. In this approach, the reciprocated member is first brought up to full reciprocating speed before pressing the terminal and workpiece together. The remaining steps of the present approach are similar to the remaining steps of the first approach.

As with the first embodiment, the predetermined force, rate, contact time, and so forth are determined by such factors as the size and shape of the respective mating surfaces, the types of metals comprising the solder and workpiece mating surfaces, the specific configuration of solder-free regions used, any process constraints which must be accommodated, etc.

In the present embodiment, the solder-free regions 138 (e.g., the longitudinal grooves) provide reservoirs where the plastically deformed solder may be smeared into so that solder beneath the smeared away plastically deformed solder can come into contact with the workpiece surface 152 and generate increasing friction and heat. This continuous, rapid process of heating up the surface layer of solder, plastically deforming it, smearing it away into the solder-free regions, exposing new layers of solder, and repeating the cycle, quickly brings the workpiece surface and the interfacing solder layer up to a temperature sufficient to facilitate interfacial galling of one metal into the other, without necessarily requiring (but not necessarily precluding) a generalized melting of the solder.

In both the rotational and reciprocal methods, the heat generated due to the friction between the solder layer and workpiece mating surfaces heats these surfaces enough to promote the galling bond described above, yet does not have to be so high as to melt the solder. Thus, a strong bond between the mating surfaces can be effected while maintaining the solder layer at an average temperature below that of the melting point of the solder. This is in direct contrast to conventional soldering methods, which require that the solder be elevated to a temperature much higher than its melting temperature.

Various other modifications to the present invention will, no doubt, occur to those skilled in the art to which the present invention pertains. For example, the workpiece mating surface 52/152 may be any portion of the workpiece surface if the workpiece is made of metal or at least has a metallic surface; alternatively, the mating surface 52/152 may be a metallic or metallized member attached to the workpiece. An example of this latter arrangement would be a glass windshield workpiece having a metallic pad adhered or fritted to the windshield; here, the metallic pad would be the workpiece mating surface 52/152. Also, the terminal can be entirely made of metal (e.g., aluminum, copper, etc.), or it can be made of plastic, ceramic, and/or other materials with a full or partial coating or piece of metal attached thereon or therein, or it can be made of a conductive ceramic or polymer; any of these configurations would provide the necessary electrically conductive path between the top end 24/124 and the bottom surface 28/128. Additionally, the bottom surface 28/128 of the terminal 20/120 may be somewhat curved to accommodate any curvature of the workpiece mating surface 52/152. Furthermore, as used herein, "plastically deformed" solder can encompass melted solder, whether the melting is localized or generalized, but doesn't necessarily require that the solder be melted. As noted above, it is not necessary to the present invention that the solder layer 30/130 generally or locally melts, but such melting is not precluded by the approach of the present invention. It is the following claims, including all equivalents, which define the scope of the invention.

What is claimed is:

1. A method for attaching a terminal to a metallic mating surface on a workpiece by friction joining, comprising the steps of:

providing the terminal and the workpiece, wherein the terminal comprises an electrically conductive body having a top end to which an electrical connector may be attached, a bottom end having a bottom surface generally conforming to the mating surface of the workpiece, a rotational axis substantially orthogonal to the bottom surface about which the terminal may be rotated, and a layer of solder attached to the bottom surface wherein the layer has an outer perimeter and defines a central solder-free region about the axis;

rotating the terminal about its rotational axis at a predetermined rotational speed while holding the workpiece stationary;

pressing together the rotating terminal and the stationary workpiece using a predetermined forging force for a predetermined length of time, so as to promote a galling bond between the mating surfaces; and abruptly stopping the rotation of the terminal.

2. A method according to claim 1, wherein during said pressing together step the solder is maintained at an average temperature below its melting temperature.

3. A method according to claim 1, further comprising the step of relieving the forging force between the terminal and the workpiece after said abruptly stopping step.

4. A method according to claim 1, wherein the rotation of the terminal is abruptly stopped within one revolution of the terminal.

5. A method according to claim 1, wherein the rotation of the terminal is abruptly stopped within one-tenth of a revolution of the terminal.

6. A method according to claim 1, wherein the central solder-free region of the layer of solder is substantially circular and substantially concentric with the rotational axis of the terminal.

7. A method according to claim 1, wherein the layer of solder further defines at least two solder-free radial grooves extending from the central solder-free region to the outer perimeter of the layer of solder, wherein the radial grooves are substantially evenly spaced about the rotational axis of the terminal.

8. A method for attaching a terminal connector to a metallic mating surface on a workpiece by friction joining, comprising the steps of:

providing the terminal and the workpiece, wherein the terminal comprises an electrically conductive body having a top end to which an electrical connector may be attached, a bottom end having a substantially flat bottom surface, and a layer of solder attached to the bottom surface wherein the layer of solder defines a plurality of solder-free regions therein;

reciprocating the terminal back and forth at a predetermined rate along a predetermined linear direction substantially parallel to the workpiece mating surface while holding the workpiece stationary;

pressing together the reciprocating terminal and the stationary workpiece using a predetermined forging force for a predetermined length of time, so as to promote a galling bond between the mating surfaces; and abruptly stopping the reciprocation of the terminal.

9. A method according to claim 8 wherein during said pressing together step the solder is maintained at an average temperature below its melting temperature.

10. A method according to claim 8 further comprising the step of relieving the forging force between the terminal and the workpiece after said abruptly stopping step.

11. A method according to claim 8 wherein the reciprocation of the terminal is abruptly stopped within one stroke of the terminal.

12. A method according to claim 8 wherein the layer of solder defines a plurality of substantially straight solder-free grooves therein oriented substantially parallel with the predetermined linear direction in which the terminal is reciprocated.

* * * * *